United States Patent [19]

Hermstein et al.

[11] 3,942,106
[45] Mar. 2, 1976

[54] VOLTAGE TRANSFORMER FOR USE IN HIGH VOLTAGE SWITCHING INSTALLATION

[75] Inventors: Wolfgang Hermstein, Nurnberg; Heinz Schiemann, Berlin, both of Germany

[73] Assignee: Siemens Aktiengesellschaft, Munich, Germany

[22] Filed: May 17, 1974

[21] Appl. No.: 470,982

[30] Foreign Application Priority Data

May 17, 1973 Germany............................ 2325447

[52] U.S. Cl................ 323/44 R; 307/147; 174/27; 174/99 R; 336/175; 323/93
[51] Int. Cl.².................... H01F 27/00; H01B 9/06
[58] Field of Search .... 307/147, 149; 323/93, 44 R, 323/60, 61, 74; 174/27, 28, 99 R, 99 B, DIG. 10; 317/255; 324/126, 127; 336/173, 174, 175

[56] References Cited
UNITED STATES PATENTS

| | | | |
|---|---|---|---|
| 1,873,977 | 8/1932 | Naef | 174/DIG. 10 |
| 3,701,944 | 10/1972 | Amalric | 174/11 BH |
| 3,730,968 | 5/1973 | Szente-Varga | 174/27 |
| 3,767,837 | 10/1973 | Graybill | 174/27 |

*Primary Examiner*—Gerald Goldberg
*Attorney, Agent, or Firm*—Kenyon & Kenyon Reilly Carr & Chapin

[57] ABSTRACT

An improved voltage transformer for use in a gas insulated or liquid insulated high voltage switching installation enclosed within a metal encapsulation and carrying several conductors, in which each conductor is surrounded by a tube which is conductive at least on its surface which faces the conductor with the tubes connected to each other through attachment means which attach them in an insulated manner to the metal encapsulation. The resulting arrangement causes each tube together with the conductor within it to form a high potential capacitor which can be coupled in series with a low potential capacitor to form a voltage divider with the voltage taken off the low potential capacitor and used to provide an indication of the voltage present on the conductor. Tubes which are plastic with conductive coatings and metal tubes are disclosed with the tubes fastened to at least one support disk of insulating material which is then attached to the metal encapsulation.

16 Claims, 5 Drawing Figures

VOLTAGE TRANSFORMER FOR USE IN HIGH VOLTAGE SWITCHING INSTALLATION

BACKGROUND OF THE INVENTION

This invention relates to high voltage switching installations of the type in which several conductors are enclosed within a metal encapsulation in general, and more particularly to an improved voltage transformer for use in such installations.

A type of voltage transformer has been disclosed in German Offenlegungsschrift No. 2,125,297 which permits voltage measurements in a single phase high-voltage switching installation. This prior art voltage transformer includes an insulator body within the metal encapsulation of the high voltage switching installation, which insulating body has a conductive coating on its inner surface facing the high voltage conductor. The conductive coating forms an extended [surface type] electrode which in cooperation with the high voltage conductor surrounded by it forms a high potential capacitor. It is coupled with a low potential capacitor to form a capacitive voltage divider with the output of the low potential capacitor coupled to an amplifier. The low potential capacitor and amplifier are located outside the metal encapsulation. This disclosure however, does not show in detail how such a voltage transformer can be mounted within the metal encapsulation.

With the knowledge that such an arrangement can be used as a voltage transformer, it is the object of this invention to provide such a voltage transformer for mounting in a metal encapsulation in a simple manner and at a low cost.

SUMMARY OF THE INVENTION

The present invention solves this problem by surrounding each of the conductors at which the voltage is to be measured by a tube which is conductive at least on the surface facing the conductor. The tubes are connected to each other in a common support and are attached in an insulated manner to the metal encapsulation. Each tube forms, along with the conductor disposed within it, a high potential capacitor which can be used in a capacitive voltage divider with a low potential capacitor. The primary advantage of the voltage transformer of the present invention is that it is of a simple design and easy to install. Furthermore, it is of such a construction that it can be accomodated within the metal encapsulation without the necessity of specially designing or preparing the latter for the installation. Various designs of the tubes of the present invention are disclosed. In one advantageous embodiment, the tubes are plastic having, on their surface facing the respective conductor, conductive coatings used as control electrodes. The use of plastic tubes facilitates the manufacture of a combined current and voltage transformer, i.e., a current transformer can simply be wound around the plastic tube. Also disclosed is an embodiment in which the tubes are metal tubes.

In the voltage transformer of the present invention, the tubes can be held in the metal encapsulation in a number of different ways. If relatively short tubes are used, a single support disk approximately in the middle of the tubes will be sufficient. The tubes are provided with fastening shoulders for mounting them to the support disk which support disk is then mounted to the encapsulation.

In the illustrated embodiments, in which relatively long tubes are used, each tube has fastening shoulders at each end. A support disk is provided at both ends of the tubes. In order to permit unimpeded expansion and contraction of the tubes in the direction of the longitudinal axis of the metal encapsulation during temperature changes, the disclosed embodiment connects only one of the support disks rigidly to the encapsulation. The other support disk simply rests against the metal encapsulation and is therefor movable in the longitudinal direction as the tubes expand and contract. As a result, buckling of the tubes due to temperature changes is impossible. The disclosed voltage transformer also includes two parts at the ends which form guard ring electrodes. These are preferably attached in a manner such that they are insulated from the tubes at both ends. A number of manners of attaching the guard electrodes are disclosed. In one particularly advantageous embodiment, both the central section of the tubes and the end sections containing the guard electrodes are fitted with fastening lugs, or fastening shoulders. Between the fastening lugs or shoulders on the main tube part and those on the end parts containing the guard electrodes, a disk of insulating material is placed. This is done at both ends of the tubes. Screws are then used to hold the combination together, i.e., the combination of the main tube portion, an insulating disk and the end portion, with the screws insulated from at least one of the portions, i.e., either insulated from the end or from the main tube parts. In the preferred embodiment, the fastening lugs or shoulders are formed by bent over edges on the tube sections.

Another advantageous embodiment for fastening the guard electrodes is accomplished by cementing the guard ring electrodes to the tubes. In this embodiment, the main portion of the tubes and the portions carrying the guard electrodes each have layers of insulating material at the point where they are to be cemented together. Layers of this nature can be applied, for example, by coating with powder or by turbulence sintering.

The dielectric medium to be used in the capacitor formed by the tube and the high voltage conductor which it encloses can advantageously be the insulating medium of the high voltage switching insulation, i.e., the gas or liquid insulating material used therein. In this manner, the manufacturing cost of the voltage transformer are reduced. However, it is also possible to fill the space inside the tubes with casting resin which then becomes the dielectric material.

It is also advantageous if an insulating disk is placed as a centering and spacing member between the conductors in their respective associated tube. Preferably, this spacer member is designed in a rib-like shape to provide a lengthened leakage path and high dielectric strength.

DETAILED DESCRIPTION OF THE PREFERRED EMBODIMENT

Figure 1:
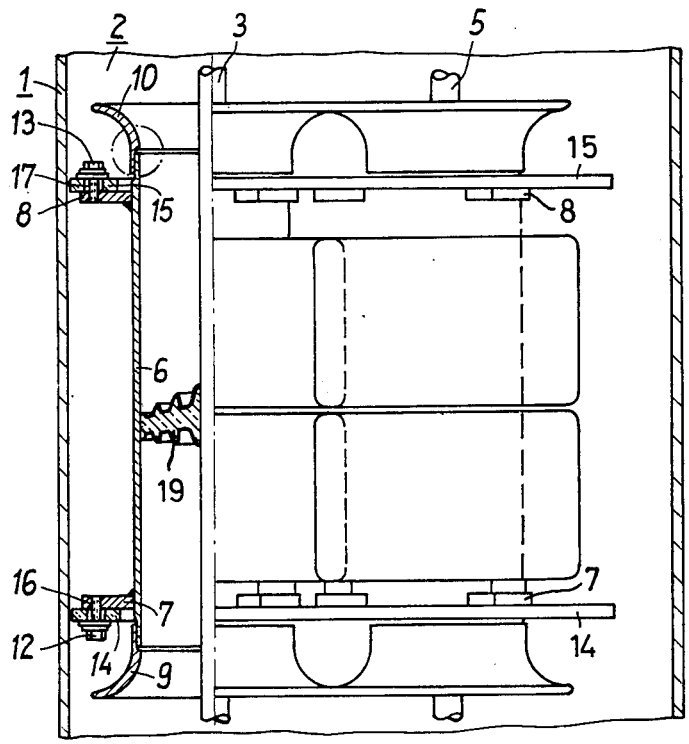
FIG. 1 is an elevation view partly in cross section of a first embodiment of the present invention.
Figure 2:
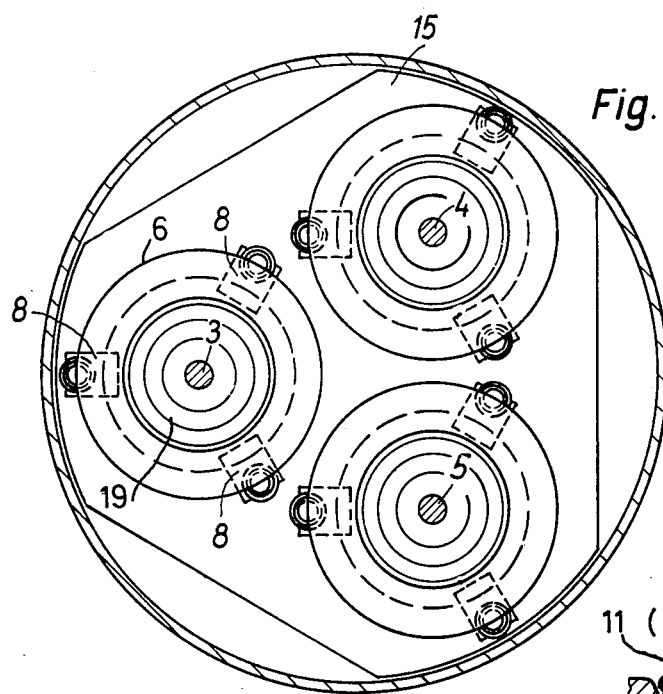
FIG. 2 is a plan view, with the metal enclosure shown in cross section of the embodiment of FIG. 1.
Figure 3:
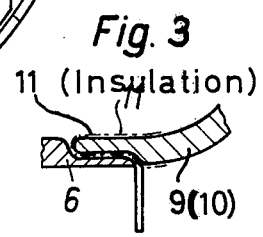
FIG. 3 is a detail shown in cross section of one manner of attaching the guard electrode ring of FIG. 1.

In the embodiment illustrated by FIGS. 1 and 2, three high voltage conductors designated 3, 4 and 5 are enclosed within a metal encapsulation 1 which is part of a high voltage switching installation designated generally as 2. According to the present invention, each of the conductors 3, 4 and 5 is surrounded by a tube 6, which in this embodiment is a metal tube. Each tube 6 is provided with fastening shoulders 7 at the bottom and fastening shoulders 8 at the top. In addition, each tube has cemented to one of its ends a tube part 9 and, at the other end, a tube part 10, the tube parts 9 and 10 being flared out and forming guard ring electrodes. As can be seen in more detail on FIG. 3, the end parts 9 and 10 contain a layer of insulation 11 at the point where they are cemented to the tubes 6 thereby causing them to be insulated from the tubes. The fastening shoulders 7 and 8 of the tube 6 are connected respectively to support disks 14 and 15 using screws 12 and 13 respectively. One of the support disks 14 or 15 is firmly connected to the metal encapsulation 1 in a conventional fashion with the other one simply resting against the metal encapsulation as a support element. Both are made of insulating material in order to avoid a metallic connection between the tube 6 and the grounded metal encapsulation. In order to permit centering of the individual tube 6 with respect to the respective conductors 3, 4 and 5 disposed within them, the support disks 14 and 15 are provided with enlarged holes permitting displacement of the individual tubes 6 in a radial direction for purposes of centering before tightening of the screws 12 and 13. Also shown on FIG. 2 is the possibility, for centering purposes, of inserting within the tubes surrounding the conductors and separating them in a spaced manner from the tubes, an insulating disk 19. The disk has a rib-like shape so that the lengthened leakage path and high dielectric strength are obtained.

FIG. 2 also illustrates that each tube 6 has three fastening shoulders 7 and 8 which are uniformerly spaced around the circumference of the tube. Each tube 6 forms together with the conductor disposed within it, a high potential capacitor which can be used with a low potential capacitor to form a capacitive voltage divider. The low potential capacitor can be located outside of the metal encapsulation 1 with an amplifier connected thereto. It should be noted however, that it is also possible to design the low potential capacitor as a circularly wound capacitor and to arrange it in a region which is formed by the respective tube and tube end parts. The advantage of this solution is that no additional space outside the metal encapsulation is required for accomodating the low potential capacitor. Furthermore with such an arrangement, the low potential capacitor is subjected to the same temperature changes as the high potential capacitor which has an advantageous effect on the constancy of the division ratio of the capacitive voltage divider.

Figure 4:
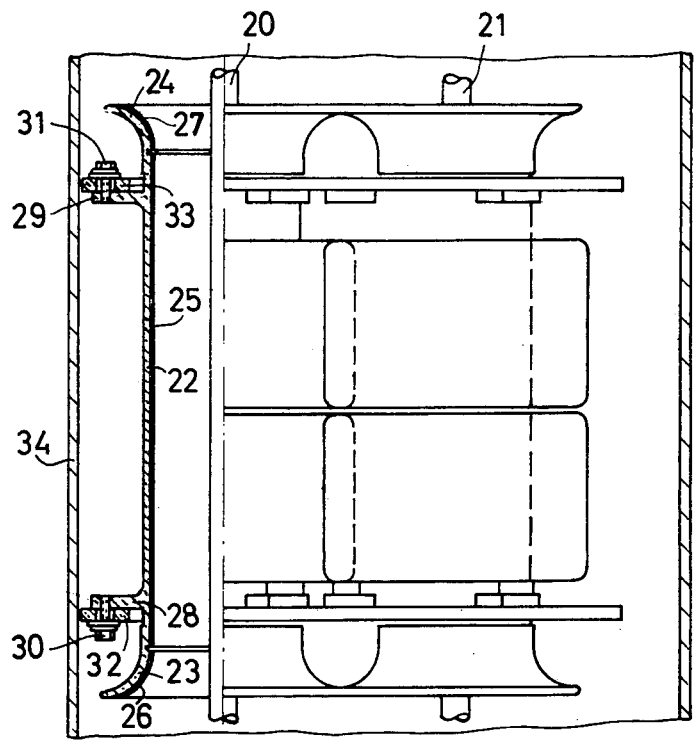
FIG. 4 is an elevation view partly in cross section of a second embodiment of the present invention.

An embodiment similar to that of FIG. 1 but in which the tubes are plastic is shown in FIG. 4. Here, plastic tubes are provided having flared out regions 23 and 24 on their ends. Each tube has on its inside a conductive coating, the conductive coating of the main portion of the tube being designated 25 and that of the end regions forming the guard ring electrodes as 26 and 27 respectively. As illustrated, the areas of conductivity at the end which form the guard ring electrodes are separated in an insulated manner from the conductive coating 25 on the main portion of the tube. The conductive coating 25 along with the high voltage conductor 20 [or 21] forms a high potential capacitor in the manner described above.

In the illustrated embodiment the plastic tubes 22 contain lower shoulders 28 and upper shoulders 29 which are molded or cast into the tube. These are connected to support disks 32 and 35 using screws 30 and 31 in the same manner as described above. In addition, in similar fashion to that described in connection with FIGS. 1 and 2, one of the support disks is rigidly connected to the metal encapsulation 34 while the other one simply rests against it as a support element and is free to slide therewith. Support disks 32 and 33 can be made of either plastic or metal.

Figure 5:
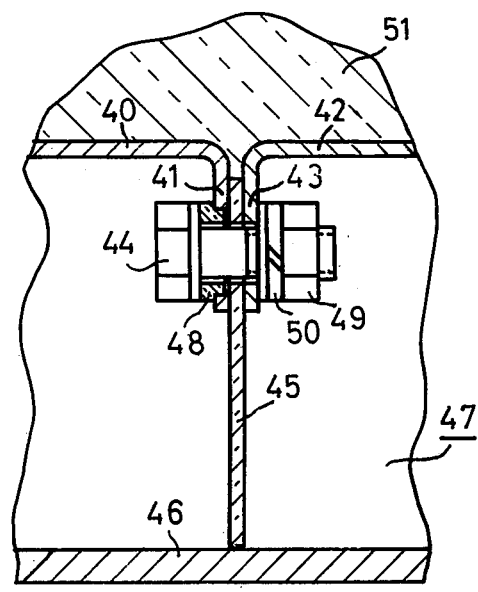
FIG. 5 is a cross sectional view illustrating a further manner of attaching the tube part containing the guard ring electrode.

FIG. 5 illustrates another manner of mounting the tubes of the present invention and attachment of the end parts containing the guard ring electrodes. In this example, tubes 40 made of metal are provided with shoulders 41. In the illustrated embodiment, the shoulders 41 comprise bent-off fastening tabs. The end portion for the guard electrodes designated 42 are similarly provided with bent-off fastening tabs 43. The tabs are, of course, aligned and contain holes to permit bolting the two ends together. To provide the necessary insulation between the tube 40 and the end part 42, a support disk 45 of insulating material containing holes matching those in the bent-off fastening tabs is interposed. In addition, an insulating bushing 48 is provided to insulate the bolt 44 from the tube 40. The three pieces, i.e., the tube 40, insulating disk 45 and end part 42 are bolted together using the bolt 44 and its nut 49 with an appropriate washer such as a lock washer 50 behind the bolt. The insulating disk 45 may take the place of the disk 14 or 15 of FIG. 1 or disk 32 or 33 of FIG. 4 and will rest against the metal encapsulation 46. As in those embodiments described above, one disk will be securely fastened to the metal encapsulation while the other disk will be free to slide therein. The dielectric for the high voltage capacitor formed by one of the conductors and its associated tube may simply be the insulating material within the switching installation, i.e., the gas or liquid with which the switching insulation is filled and which provides insulation therefor. However, as illustrated on FIG. 5, it is also possible to fill in the space within the tubes with a casting resin 51.

Thus, an improved voltage transformer arrangement for an encapsulated switching installation has been shown. Although specific embodiments have been illustrated and described, it will be obvious to those skilled in the art that various modifications may be made without departing from the spirit of the invention which is intended to be limited solely by the appended claims.

What is claimed is:

1. A voltage transformer for use in a gas insulated or liquid insulated high voltage switching installation having a metal encapsulation enclosing a plurality of conductors comprising:
   a. a plurality of tubes with at least one tube surrounding each conductor, each of said tubes being conductive at least on the surface facing its respective conductors;
   b. means connecting the tubes together and attaching them to the metal encapsulation so as to be insulated with respect to each other and the metal encapsulation; whereby each tube together with its respective conductor disposed within it will form a high potential capacitor which can be coupled to a low potential capacitor to form a voltage divider permitting measurement of the voltage on the associated conductor.

2. A voltage transformer according to claim 1 wherein said tubes are plastic tubes having a conductive coating at least on the surface facing the respective conductors.

3. A voltage transformer according to claim 1 wherein said tubes are metal tubes.

4. A voltage transformer according to claim 1 wherein said tubes are fastened together by fastening to at least one support disk, with said support disk attached to the metal encapsulation.

5. A voltage transformer according to claim 4 wherein said tubes are metal tubes and said support disk is made of an insulating material.

6. A voltage transformer according to claim 4 wherein each of said tubes contains fastening shoulders at both ends and where two support disks are provided and fastened to the respective shoulders at the ends of each tube.

7. A voltage transformer according to claim 6 wherein said tubes are metal tubes and said support disks are of insulating material.

8. A voltage transformer according to claim 1 and further including end parts attached in an insulated manner to both ends of each of said tubes to form guard ring electrodes.

9. A voltage transformer according to claim 6 and further including end parts attached in an insulated manner to both ends of each of said tubes to form guard ring electrodes.

10. A voltage transformer according to claim 8 wherein said tubes are provided with fastening lugs on their ends and wherein said end parts forming guard ring electrodes are provided with matching lugs and wherein a support disk of insulating materials is interposed between said tube lugs and said end part lugs, said tube, said end part and said insulating disk being bolted together, with means provided for insulating said bolt from at least said tube or said end part.

11. A voltage transformer according to claim 10 wherein said fastening lugs comprise bent-off edges of said tubes and tube parts.

12. A voltage transformer according to claim 8 wherein said end parts forming guard ring electrodes are cemented to said tubes.

13. A voltage transformer according to claim 1 wherein the dielectric medium of the capacitor formed by said tube and its associated conductor is the insulating medium of said high voltage switching installation.

14. A voltage transformer according to claim 1 wherein the space within said tubes is filled with casting material acting as a dielectric.

15. A voltage transformer according to claim 1 and further including an insulator disk between each of said conductors and their associated tube acting as a centering and spacer element.

16. A voltage transformer according to claim 15 wherein said insulator disk is of a ribbed design to provide a lengthened leakage path and high dielectric strength.

* * * * *